US011848360B2

(12) United States Patent
Nakamura et al.

(10) Patent No.: US 11,848,360 B2
(45) Date of Patent: Dec. 19, 2023

(54) INTEGRATED ASSEMBLIES AND METHODS OF FORMING INTEGRATED ASSEMBLIES

(71) Applicant: Micron Technology, Inc., Boise, ID (US)

(72) Inventors: Yoshitaka Nakamura, Boise, ID (US); Devesh Dadhich Shreeram, Boise, ID (US); Yi Fang Lee, Boise, ID (US); Scott E. Sills, Boise, ID (US); Jerome A. Imonigie, Boise, ID (US); Kaustubh Shrimali, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

(21) Appl. No.: 17/350,355

(22) Filed: Jun. 17, 2021

(65) Prior Publication Data
US 2022/0406899 A1 Dec. 22, 2022

(51) Int. Cl.
*H01L 29/267* (2006.01)
*H10B 12/00* (2023.01)
*H01L 23/528* (2006.01)
*H10B 53/30* (2023.01)

(52) U.S. Cl.
CPC ........ *H01L 29/267* (2013.01); *H01L 23/5283* (2013.01); *H10B 12/033* (2023.02); *H10B 12/05* (2023.02); *H10B 12/315* (2023.02); *H10B 12/482* (2023.02); *H10B 53/30* (2023.02)

(58) Field of Classification Search
None
See application file for complete search history.

(56) References Cited

U.S. PATENT DOCUMENTS

| 11,462,542 | B2 * | 10/2022 | Wada | H10B 12/03 |
| 2012/0007258 | A1 * | 1/2012 | Oh | H01L 29/7827 |
| | | | | 438/653 |
| 2012/0168843 | A1 * | 7/2012 | Seo | H10B 12/482 |
| | | | | 438/266 |
| 2012/0208364 | A1 * | 8/2012 | Rouh | H01L 21/31144 |
| | | | | 438/666 |
| 2015/0030929 | A1 * | 1/2015 | Barker | C01G 53/006 |
| | | | | 429/231.1 |
| 2017/0317145 | A1 * | 11/2017 | Hong | G06F 3/0446 |
| 2019/0296155 | A1 * | 9/2019 | Sawabe | H01L 29/66969 |
| 2021/0082921 | A1 * | 3/2021 | Wada | H10B 12/30 |

* cited by examiner

*Primary Examiner* — Steven M Christopher
(74) *Attorney, Agent, or Firm* — Wells St. John P.S.

(57) ABSTRACT

Some embodiments include an integrated assembly containing a first structure which includes one or more transition metals, and containing a second structure over the first structure. The second structure has a first region directly against the first structure and has a second region spaced from the first structure by a gap region. The second structure includes semiconductor material having at least one element selected from Group 13 of the periodic table in combination with at least one element selected from Groups 15 and 16 of the periodic table. An ionic compound is within the gap region. Some embodiments include a method of forming an integrated assembly.

38 Claims, 2 Drawing Sheets

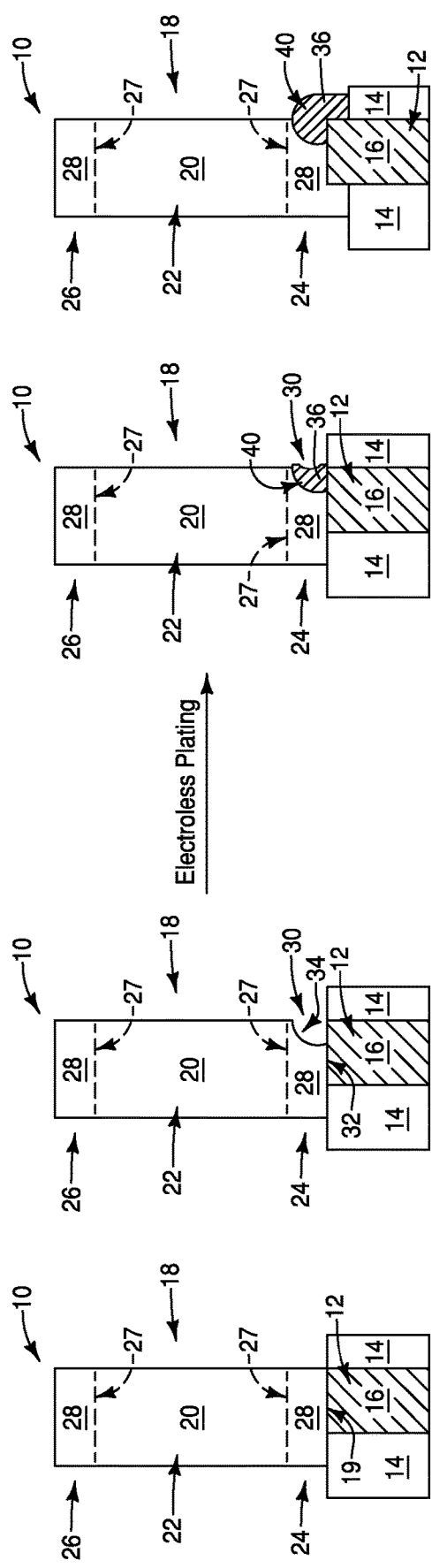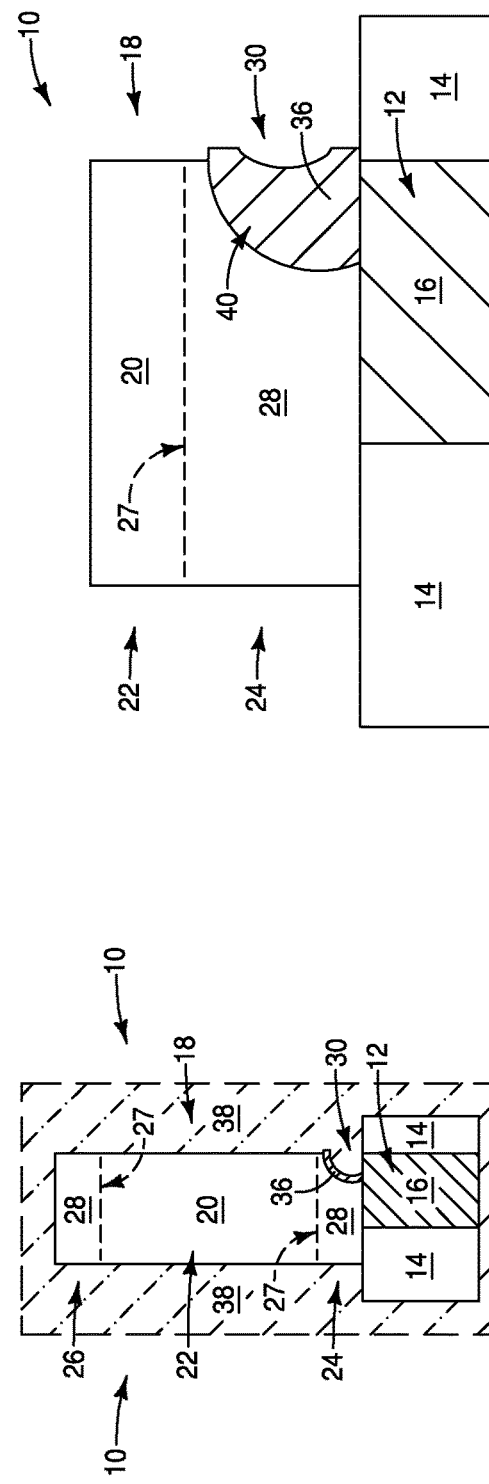

US 11,848,360 B2

INTEGRATED ASSEMBLIES AND METHODS OF FORMING INTEGRATED ASSEMBLIES

TECHNICAL FIELD

Integrated assemblies (e.g., integrated memory). Methods of forming integrated assemblies.

BACKGROUND

Memory may utilize memory cells which individually comprise an access device (e.g., an access transistor) in combination with a storage element (e.g., a capacitor, a resistive memory device, a phase change memory device, etc.).

It would be desirable to develop improved transistors and improved memory architecture.

BRIEF DESCRIPTION OF THE DRAWINGS

FIG. 1 is a diagrammatic cross-sectional side view of an example assembly.

FIG. 2A is a diagrammatic cross-sectional side view of an example assembly illustrating an example problem.

FIG. 2A-1 is a diagrammatic cross-sectional side view of the example assembly of FIG. 2A at an example process stage subsequent to that of FIG. 2A, and showing the assembly treated with an example method for curing, or at least alleviating, the example problem.

FIG. 2B is a diagrammatic cross-sectional side view of the example assembly of FIG. 2A at an example process stage subsequent to that of FIG. 2A (and subsequent to that of FIG. 2A-1).

FIG. 2B-1 is a diagrammatic cross-sectional side view showing an enlarged region of the example assembly of FIG. 2B.

FIG. 3 is a diagrammatic cross-sectional side view of another example assembly.

DETAILED DESCRIPTION OF THE ILLUSTRATED EMBODIMENTS

Figure 4A:
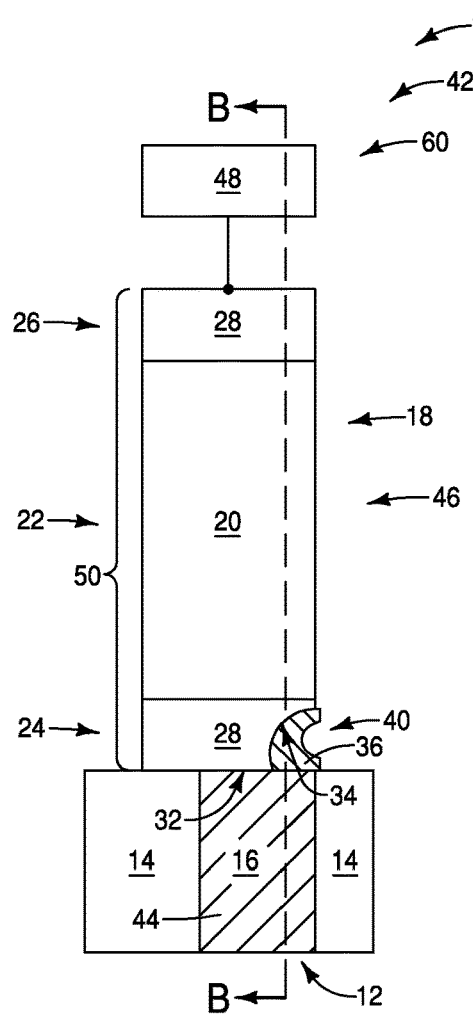
FIGS. 4A and 4B are diagrammatic cross-sectional side views showing the example assembly of FIG. 2B incorporated into an example memory structure. The view of FIG. 4A is along the line A-A of FIG. 4B, and the view of FIG. 4B is along the line B-B of FIG. 4A.

Some embodiments include integrated assemblies having an ionic compound along an interface between a transistor active region and an underlying conductive structure. Some embodiments include memory cells and memory arrays. Some embodiments include methods of forming integrated assemblies, such as, for example, integrated assemblies which include memory cells and memory arrays. Example embodiments are described with reference to FIGS. 1-5.

Referring to FIG. 1, an integrated assembly 10 includes a conductive first structure 12 extending within an insulative material 14.

The first structure 12 comprises a conductive material 16. The conductive material 16 may comprise any suitable electrically conductive composition(s); such as, for example, one or more of various metals (e.g., titanium, tungsten, cobalt, nickel, platinum, ruthenium, molybdenum, tantalum, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 16 is a metal-containing material which includes one or more transition metals (with transition metals being understood to be elements selected from groups 3-12 of the periodic table, and including the elements of the lanthanide series and the elements of the actinide series). In some embodiments, the conductive material 16 is a metal-containing material which includes one or more of cobalt (Co), copper (Cu), iridium (Ir), molybdenum (Mo), ruthenium (Ru), tantalum (Ta), titanium (Ti) and tungsten (W). The conductive material 16 may be homogeneous (as shown), may be a laminate of two or more different compositions, etc. In some embodiments, the conductive material 16 may comprise one or more metals, with at least one of such metals being in the form of a metal oxide, a metal silicide, a metal carbide, a metal nitride and/or a metal boride.

The insulative material 14 may comprise any suitable composition(s), and in some embodiments may comprise, consist essentially of, or consist of one or both of silicon dioxide and silicon nitride. The insulative material 14 may be homogeneous (as shown), may comprise a laminate of two or more different compositions, etc.

The conductive structure 12 and insulative material 14 may be supported by a semiconductor base (not shown). The base may comprise semiconductor material; and may, for example, comprise, consist essentially of, or consist of monocrystalline silicon. The base may be referred to as a semiconductor substrate. The term "semiconductor substrate" means any construction comprising semiconductive material, including, but not limited to, bulk semiconductive materials, such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

A second structure 18 is over the first structure 12, and has a lower surface 19 directly against the first structure. The second structure 18 comprises semiconductor material 20. The semiconductor material 20 may comprise any suitable composition(s), and in some embodiments may comprise, consist essentially of, or consist of at least one metal (e.g., one or more of aluminum, gallium, indium, thallium, tin, cadmium, zinc, etc.) in combination with one or more of oxygen, nitrogen, sulfur, selenium and tellurium. In some embodiments, the semiconductor material 20 may comprise at least one element from Group 13 of the periodic table (e.g., gallium) in combination with at least one element from Groups 15 and 16 of the periodic table (e.g., nitrogen, oxygen, etc.). For instance, the semiconductor material 20 may comprise at least one element selected from the group consisting of gallium, indium and mixtures thereof, in combination with at least one element selected from the group consisting of oxygen, nitrogen, sulfur, selenium, tellurium and mixtures thereof. In some embodiments, the semiconductor material 20 may comprise, consist essentially of, or consist of a semiconductor oxide (i.e., a semiconductor material comprising oxygen). For instance, in some embodiments the semiconductor material 20 may comprise, consist essentially of, or consist of InGaZnO (where the chemical formula indicates primary constituents rather than a specific stoichiometry). The material 20 may be homogeneous, may comprise a laminate of two or more different compositions, etc.

The structure 18 is configured as a vertically-extending pillar in the illustrated embodiment of FIG. 1. In other embodiments, the structure 18 may have a different configuration.

The structure 18 may be considered to comprise a central region (central portion) 22, and to comprise outer regions (outer portions) 24 and 26 on opposing sides of the central region. The outer regions 24 and 26 may comprise the same composition 20 as the central region 22, or may comprise different compositions relative to the central region 22. If the outer regions 24 and 26 comprise different compositions than the central region 22, the outer regions 24 and 26 may comprise a same composition as one another or may comprise different compositions relative to one another.

In some embodiments, the outer regions 24 and 26 may be configured as conductive regions. In such embodiments, the outer regions 24 and 26 may comprise conductive-oxide-material (e.g., conductive-metal-oxide) 28. The conductive-oxide-material may comprise any suitable composition(s), and in some embodiments may comprise, consist essentially of, or consist of oxygen in combination with one or more of indium, zinc and tin. In some embodiments, the conductive-oxide-material 28 may comprise oxygen in combination with zinc (e.g., may comprise zinc oxide), and may further comprise one or both of aluminum and gallium. The aluminum and gallium may be present as dopants within zinc oxide. In some embodiments, the conductive-oxide-material 28 may comprise, consist essentially of, or consist of oxygen in combination with indium (e.g., may comprise indium oxide). Dopant(s) may or may not be present within the indium oxide.

Dashed lines 27 are provided to diagrammatically illustrate boundaries which may exist in embodiments in which the outer regions 24 and 26 comprise a different composition than the central region 22.

In some embodiments, the assembly 10 of FIG. 1 may be formed by initially forming the first structure 12 to extend within an opening provided through the insulative material 14. Subsequently, the material(s) of the second structure is/are formed over the first structure 12, and is/are patterned into the second structure 18.

The integrated assembly 10 of FIG. 1 has an idealized interface between the second structure 18 and the first structure 12. In practice, there may be etching into one or both of the structures 12 and 18 during patterning of the second structure 18, and/or during other process steps, which may lead to a gap region 30 of the type illustrated in FIG. 2A. The gap region 30 undercuts a portion of the second structure 18 and may lead to a poorer electrical connection between the second structure 18 and the first structure 12 than is theoretically achievable with the idealized configuration of FIG. 1. Some embodiments pertain to methods of providing conductive material within the gap region 30 to improve the electrical connection between the first and second structures 12 and 18.

In some embodiments, the second structure 18 of FIG. 2A may be considered to have a configuration in which a first region 32 is directly against an upper surface of the conductive first structure 12, and in which a second region 34 is spaced from the first structure 12 by the gap region 30. In the illustrated embodiment, the second region 34 is vertically offset from the upper surface of the conductive first structure 12.

The gap region 30 is shown to extend into the material of the second structure 18, and not into the material of the first structure 12. In other embodiments, the gap region 30 may extend into the material of the first structure 12 either in addition to, or alternatively to, extending into the material of the second structure 18.

In the shown embodiment, the gap region extends into the outer portion 24 of the structure 18. Accordingly, in some embodiments the gap region 30 may extend into conductive-oxide-material 28 of the outer region 24.

Electroless plating (and/or other suitable processing) may be utilized to form an ionic compound 36 within the gap region 30 (as shown in FIGS. 2A-1, 2B and 2B-1). The ionic compound 36 may include one or more transition metals from the first material 16, one or more elements of the semiconductor material 20, one or more elements of conductive-oxide-material 28 (in embodiments in which the material 28 is present) and/or may include one or more elements in addition to the elements present in the materials 16, 20 and 28. Although the material 36 is referred to as being "an ionic compound", it is to be understood that the material may include a mixture of multiple ionic compounds in some embodiments. Such mixture may or may not be homogeneous. The formation of the ionic compound 36 within the gap region 30 may be referred to as a "self-healing" process which cures the defect imposed by the gap region 30.

FIG. 2A-1 shows the assembly 10 at an example process stage during an example electroless-plating-procedure. The integrated assembly 10 is provided within a solution 38, and then the ionic compound 36 is generated. The ionic compound is shown to selectively plate along materials within the gap region 30. The ionic compound 36 may plate along a surface of the conductive material 16 and/or along surfaces of the metal-oxide-material 28 (when such material is present) and/or along surfaces of the semiconductor material 20 (particularly if such surfaces are exposed along the gap region 30). In some embodiments, the material 36 (the ionic-compound-material) is selectively plated to be only within the gap region 30. In other embodiments, the material 36 may extend beyond the gap region 30. If excess material 36 is problematic, such may be removed with one or more suitable etches.

The ionic compound 36 may comprise one or more transition metals from the first structure 16. Additionally, or alternatively, the ionic compound 36 may comprise one or more elements from the semiconductor material 20 and/or from the metal-oxide-material 28 (when present). Additionally, or alternatively, the ionic compound 36 may comprise one or more elements from additives (e.g., ionic salts) provided within the solution 38. In some embodiments, the conductive material 16 of the first structure 12 comprises tungsten, the second material 20 of the second structure 18 comprises Ga, In and Zn, and the ionic compound 36 comprises, consists essentially of, or consists of, one or more of gallium tungstate ($Ga_2[WO_4]_3$), indium tungstate ($In_2[WO_4]_3$) and zinc tungstate ($Zn[WO_4]$); where the tungsten is provided from the first structure 12, and the gallium, indium and/or zinc is provided from the second structure 18. In some embodiments, the conductive-metal-oxide 28 is present within the outer region 24, and comprises one or both of indium oxide and zinc oxide, the first structure 12 comprises tungsten, and the ionic compound 36 comprises, consist essentially of, or consist of one or both of $In_2[WO_4]_3$ and $Zn[WO_4]$; where the tungsten is provided from the first structure 12, and the indium and/or zinc is provided from the material 28 of the second structure 18.

Possible reactions that may be utilized during example electroless plating are:

$$In \rightarrow In^{3+}+3e- \tag{I}$$

$$Ga \rightarrow Ga^{3+}+3e- \tag{II}$$

$$Zn \rightarrow Zn^{2+}+2e- \tag{III}$$

$$W+4H_2O+2e- \rightarrow WO_4^{2-}+4H_2 \tag{IV}$$

$$In+(3/2)W+6H_2O \rightarrow In^{3+}+(3/2)WO_4^{2-}+6H_2(E°=1.949) \tag{V}$$

$$Ga+(3/2)W+6H_2O \rightarrow Ga^{3+}+(3/2)WO_4^{2-}+6H_2 \\ (E°=2.14) \tag{VI}$$

$$Zn+W+4H_2 \rightarrow Zn^{2+}+WO_4^{2-}+4H_2(E°=1.837) \tag{VII}$$

$$2In^{3+}+3WO_4^{2-} \rightarrow 2In_2[WO_4]_3 \tag{VIII}$$

$$2Ga^{3+}+3WO_4^{2-} \rightarrow 2Ga_2[WO_4]_3 \tag{IX}$$

$$Zn^{2+}+WO_4^{2-} \rightarrow Zn[WO_4] \tag{X}$$

The symbol E° represents standard electrode potential. The equations V, VI and VII may occur spontaneously to form the ionic compound 36. Such spontaneous reactions may occur at any suitable temperatures and pressures, including, for example room temperature (about 20° C.) and atmospheric pressure (about 760 mm Hg).

The solution 38 may be basic, neutral or acidic. In some embodiments, the solution 38 may comprise water (e.g., deionized water). The solution 38 may or may not comprise additional additives besides the water. In some embodiments, the solution 38 may comprise citric acid to make the solution acidic, may comprise ammonium hydroxide to make the solution basic, etc. In some embodiments, the solution 38 may comprise additives known in the industry as SC1 (standard clean 1), which may include ammonium hydroxide ($NH_4OH$) and hydrogen peroxide ($H_2O_2$).

The solution 38 may include one or more ionic salts having cationic component(s) which is/are incorporated into the ionic compound 36. An example ionic salt may include a sulfate, phosphate, citrate, etc., of $Ga^{3+}$, and the $Ga^{3+}$ may be incorporated into the ionic compound 36 as gallium tungstate. Similarly, example ionic salts may include $Zn^{2+}$, $In^{3+}$, etc. The cationic component(s) within the ionic salts may or may not be the same as elements within the semiconductor material 20 and/or the conductive-metal-oxide 28 (when such conductive-metal-oxide is present).

Example mechanisms of forming the material 36 are described herein to assist the reader in understanding some possible aspects of the invention, and are not to limit the invention, except to the extent, if any, that such mechanisms are expressly recited in the claims which follow.

FIG. 2B shows the assembly 10 after the ionic compound 36 is formed within the gap region 30. In the illustrated embodiment, the ionic compound 36 substantially entirely fills the gap region 30. Generally, the material 36 may be formed to fill at least the majority of the gap region 30, and in some embodiments may be formed to fill the entirety of the gap region.

FIG. 2B-1 shows an enlarged view of a portion of the assembly 10 of FIG. 2B, and shows the ionic compound 36 substantially entirely filling the gap region 30 to form a conductive interconnect 40 which extends across the gap region 30 to improve electrical connection between the first and second structures 12 and 18.

The embodiment of FIG. 2B shows the conductive interconnect 40 primarily along an upper surface of the conductive structure 12. In other embodiments, the conductive interconnect 40 of the ionic compound 36 may extend along a side of the first structure 12, as well as along an upper surface of the first structure 12, as shown in FIG. 3.

Figure 4B:
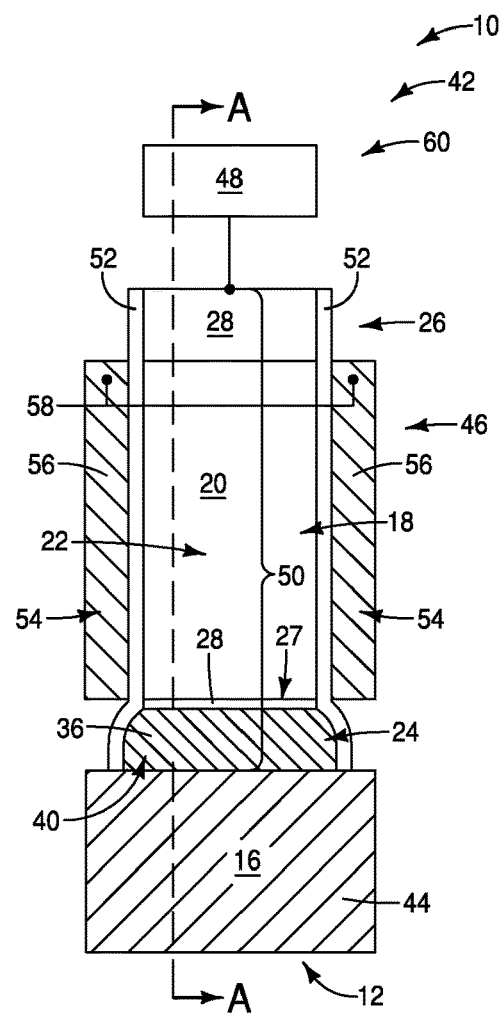

In some embodiments, the structures 12 and 18 may be incorporated into a memory configuration. FIGS. 4A and 4B show a memory configuration 42 comprising the structures 12 and 18 of the assembly 10. The figures illustrate cross-sectional views of the same configuration, with the view of FIG. 4A being along the line A-A of FIG. 4B, and with the view of FIG. 4B being along the line B-B of FIG. 4A.

The first conductive structure 12 corresponds to a digit line 44, and the second structure 18 corresponds to an active region 50 of an access transistor 46. The active region includes the semiconductor material 20 within the central region 22 of the structure 18, and includes the conductive-oxide-material 28 within the outer regions 24 and 26 of the structure 18. The boundaries 27 are shown as solid lines to indicate that such boundaries exist (rather than being optional) in the illustrated embodiment of FIGS. 4A and 4B. In other embodiments, the metal-oxide-material 28 may be optional in the active regions of the access transistors.

The outer regions 24 and 26 are lower and upper conductive regions, respectively, of the active region 50, and the central region 22 is a channel region of the active region 50. The regions 24 and 26 may be referred to as source/drain regions in some embodiments.

The lower conductive region 24 is electrically coupled with the digit line 44. The digit line 44 is a linearly-extending structure which extends in and out of the page relative to the cross-sectional view of FIG. 4A, and which extends along the page relative to the cross-sectional view of FIG. 4B.

The upper conductive region 26 is electrically coupled with a storage element 48. The storage element 48 may be any suitable device having at least two detectable states. In some embodiments, the storage element 48 may be, for example, a capacitor, a resistive-memory-device, a conductive-bridging-device, a phase-change-memory (PCM) device, a programmable-metallization-cell (PMC), etc. If the storage element 48 is a capacitor, it may be either a ferroelectric capacitor (i.e., may comprise ferroelectric insulative material between a pair of capacitor electrodes) or may be a non-ferroelectric capacitor (i.e., may comprise only non-ferroelectric insulative material between a pair of capacitor electrodes). Example ferroelectric insulative material may include one or more of transition metal oxide, zirconium, zirconium oxide, niobium, niobium oxide, hafnium, hafnium oxide, lead zirconium titanate, and barium strontium titanate. Example non-ferroelectric insulative material may comprise, consist essentially of, or consist of silicon dioxide.

The access transistor 46 includes insulative material 52 along sidewalls of the active region 50. In the shown embodiment, the insulative material 52 extends to an upper surface of the upper conductive region 26. In other embodiments, the insulative material 52 may extend to a different height along the active region 50.

The insulative material 52 may be referred to as gate dielectric material. The insulative material 52 may comprise any suitable composition(s), and in some embodiments may comprise silicon dioxide and/or one or more high-k compositions (with the term "high-k" meaning a dielectric constant greater than that of silicon dioxide). Example high-k compositions (materials) include aluminum oxide, zirconium oxide, hafnium oxide, etc.

Gating structures (conductive gates) 54 are adjacent to the active region 50. The gating structures 54 comprise conductive-gate-material 56. The conductive-gate-material may comprise any suitable electrically conductive composition (s); such as, for example, one or more of various metals (e.g., titanium, tungsten, molybdenum, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The conductive-gate-material 56 may be coupled with (and in some embodiments may be part of) a wordline 58 which extends in and out of the page relative to the cross-sectional view of FIG. 4B.

Operation of the transistor 46 comprises gatedly coupling the conductive regions 24 and 26 to one another through the central region 22 (the region 22 may be referred to as a gated channel region, or simply as a channel region). When the term "gated coupling" is utilized herein, such may refer to the controlled coupling/decoupling of the regions 24 and 26 that may be induced by electrical activation/deactivation the wordline 58. In some operational modes of the transistor 46, electrical flow through the channel region 22 is induced by an electric field provided by the gating structure 54 (wordline 58), and accordingly the digit line 44 is electrically coupled through the active region 50 to the storage element 48. In other operational modes, a suitable electric field is not provided to the channel region 22, and accordingly the digit line 44 is decoupled from the storage element 48.

Figure 5:
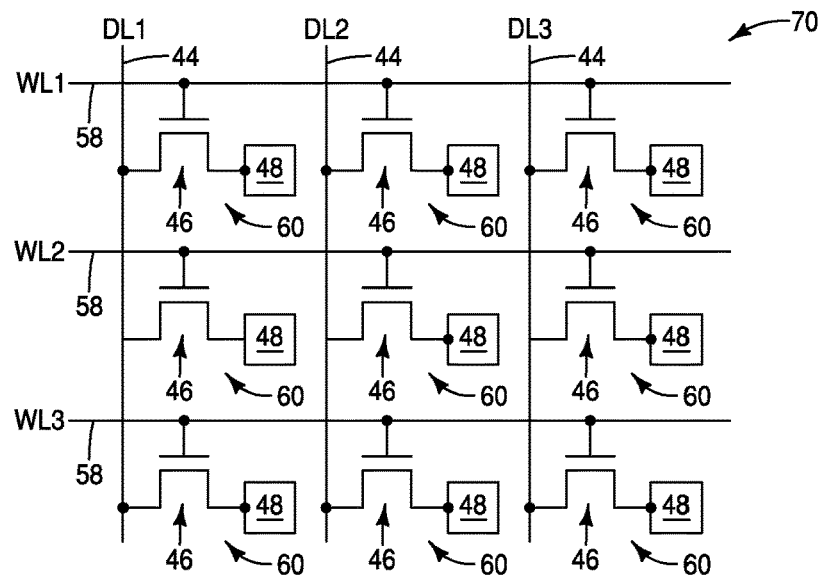
FIG. 5 is a diagrammatic schematic view of an example region of an example memory array.

A memory cell 60 may be considered to comprise the access transistor 46 together with the storage element 48. The memory cell may be representative of many substantially identical memory cells of a memory array (memory configuration 42), with the term "substantially identical" meaning identical to within reasonable tolerances of fabrication and measurement. Similarly, the wordline 58 may be representative of many substantially identical wordlines, and the digit line 44 may be representative of many substantially identical digit lines. FIG. 5 diagrammatically illustrates an example region of an example memory array 70. The memory array includes a plurality of memory cells 60, a plurality of digit lines 44 (labeled DL1-DL3), and a plurality of wordlines 58 (labeled WL1-WL3). Each of the memory cells 60 is uniquely addressed by one of the wordlines in combination with one of the digit lines. The memory array may comprise any suitable number of memory cells, wordlines and digit lines; and in some embodiments may comprise thousands, hundreds of thousands, millions, hundreds of millions, etc., of memory cells, together with an appropriate number of wordlines and digit lines.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly containing a first structure which includes one or more transition metals, and containing a second structure over the first structure. The second structure has a first region directly against the first structure and has a second region spaced from the first structure by a gap region. The second structure includes semiconductor material having at least one element selected from Group 13 of the periodic table in combination with at least one element selected from Groups 15 and 16 of the periodic table. An ionic compound is within the gap region.

Some embodiments include a memory configuration comprising a digit line which includes one or more transition metals, and comprising a transistor over the digit line. The transistor has an active region which includes a semiconductor material containing at least one element selected from Group 13 of the periodic table in combination with at least one element selected from Groups 15 and 16 of the periodic table. The active region is coupled with the digit line and has a lower surface with a first portion directly against the digit line and with a second portion spaced from the digit line by a gap region. The transistor includes a gating structure operatively adjacent to the active region. The gating structure is coupled with a wordline. An ionic compound is within the gap region. The ionic compound comprises at least one of the one or more transition metals from the digit line. A storage element is over the active region and is coupled with the active region.

Some embodiments include a method of forming an integrated assembly. A first structure is formed to include one or more transition metals. A second structure is formed over the first structure. The second structure has a first region directly against the first structure and has a second region spaced from the first structure by a gap region. The second structure comprises semiconductor material which includes at least one element selected from Group 13 of the periodic table in combination with at least one element selected from Groups 15 and 16 of the periodic table. An ionic compound is formed within the gap region.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
   a first structure which includes one or more transition metals;
   a second structure over the first structure and establishing an interface entirely across the first and second structures; the second structure having a first region directly against the first structure at the interface and a second region spaced from the first structure; a gap region at the interface; the second structure comprising semiconductor material which includes at least one element selected from Group 13 of the periodic table in combination with at least one element selected from Groups 15 and 16 of the periodic table; and
   an ionic compound within the gap region.

2. The integrated assembly of claim 1 wherein the ionic compound comprises at least one of the one or more transition metals from the first structure.

3. The integrated assembly of claim 2 wherein said at least one of the one or more transition metals includes one or more of cobalt, copper, iridium, molybdenum, ruthenium, tantalum, titanium and tungsten.

4. The integrated assembly of claim 2 wherein the first structure includes said at least one of the one or more transition metals in the form of one or more of a metal oxide, a metal silicide, a metal carbide, a metal nitride and a metal boride.

5. The integrated assembly of claim 2 wherein the ionic compound further comprises one or more of the elements of the semiconductor material of the second structure.

6. The integrated assembly of claim 2 wherein the ionic compound further comprises one or more elements which are not present in either the first structure or the second structure.

7. The integrated assembly of claim 2 wherein the first structure comprises tungsten, the second structure comprises gallium, and the ionic compound comprises gallium tungstate.

8. The integrated assembly of claim 2 wherein the first structure comprises tungsten, the second structure comprises indium, and the ionic compound comprises indium tungstate.

9. The integrated assembly of claim 2 wherein the one or more transition metals of the first structure are first transition metals, wherein the second structure comprises one or more second transition metals, and wherein the ionic compound comprises at least one of the second transition metals.

10. The integrated assembly of claim 9 wherein the one or more second transition metals include zinc, wherein the one or more first transition metals include tungsten, and wherein the ionic compound comprises zinc tungstate.

11. The integrated assembly of claim 1 wherein the second structure includes a central portion between a pair of outer portions; wherein the central portion comprises the semiconductor material; wherein the outer portions comprise one or more conductive-oxide-materials; and wherein the first and second regions are along an outer surface of one of the outer portions.

12. The integrated assembly of claim 11 wherein the outer portions comprise a same conductive-oxide-material as one another.

13. The integrated assembly of claim 11 wherein the outer portions comprise different conductive-oxide-materials relative to one another.

14. The integrated assembly of claim 11 wherein said one of the outer portions comprises indium oxide, wherein said first structure comprises tungsten, and wherein said ionic compound comprises indium tungstate.

15. The integrated assembly of claim 1 wherein the ionic compound fills at least the majority of the gap region.

16. The integrated assembly of claim 1 wherein the ionic compound fills an entirety of the gap region.

17. The integrated assembly of claim 1 wherein the gap region exposes the one or more transition metals of the first structure.

18. The integrated assembly of claim 17 wherein the ionic compound couples the one or more transition metals of the first structure to the second structure.

19. The integrated assembly of claim 1 wherein:
   the gap region comprises a curved periphery in the second structure; and
   the ionic compound lines the curved periphery and does not fill the gap region.

20. The integrated assembly of claim 1 wherein:
   the ionic compound comprises at least one of the one or more transition metals from the first structure; and
   said at least one of the one or more transition metals includes one or more of cobalt, copper, molybdenum, ruthenium, tantalum and titanium.

21. The integrated assembly of claim 1 wherein:
   the ionic compound comprises at least one of the one or more transition metals from the first structure; and
   said first structure includes the at least one of the one or more transition metals in the form of one or more of a metal silicide, a metal carbide, a metal nitride and a metal boride.

22. An integrated assembly, comprising:
   a first structure which includes one or more transition metals;
   a second structure over and directly against the first structure establishing an interface entirely between the first and second structures; the second structure comprising semiconductor material which includes at least one element selected from Group 13 of the periodic table in combination with at least one element selected from Groups 15 and 16 of the periodic table;
   a gap region undercutting a portion of the second structure at the interface; and
   an ionic compound within the gap region.

23. The integrated assembly of claim 22 wherein the gap region exposes the one or more transition metals of the first structure.

24. The integrated assembly of claim 23 wherein the ionic compound couples the one or more transition metals of the first structure to the second structure.

25. The integrated assembly of claim 22 wherein:
the gap region comprises a curved periphery in the second structure; and
the ionic compound lines the curved periphery and does not fill the gap region.

26. The integrated assembly of claim 22 wherein:
the ionic compound comprises at least one of the one or more transition metals from the first structure; and
said at least one of the one or more transition metals includes one or more of cobalt, copper, molybdenum, ruthenium, tantalum and titanium.

27. The integrated assembly of claim 22 wherein:
the ionic compound comprises at least one of the one or more transition metals from the first structure; and
said first structure includes the at least one of the one or more transition metals in the form of one or more of a metal silicide, a metal carbide, a metal nitride and a metal boride.

28. An integrated assembly, comprising:
a first structure which includes one or more transition metals;
a second structure over, directly against, and electrically coupled with, the first structure; the second structure comprising semiconductor material which includes at least one element selected from Group 13 of the periodic table in combination with at least one element selected from Groups 15 and 16 of the periodic table;
a gap region between the first and second structures;
an ionic compound within the gap region that facilitates the electrical coupling of the first and second structures; and
wherein the gap region exposes the one or more transition metals of the first structure.

29. The integrated assembly of claim 28 wherein the ionic compound couples the one or more transition metals of the first structure to the second structure.

30. The integrated assembly of claim 28 wherein:
the gap region comprises a curved periphery in the second structure; and
the ionic compound lines the curved periphery and does not fill the gap region.

31. The integrated assembly of claim 28 wherein:
the ionic compound comprises at least one of the one or more transition metals from the first structure; and
said at least one of the one or more transition metals includes one or more of cobalt, copper, molybdenum, ruthenium, tantalum and titanium.

32. The integrated assembly of claim 28 wherein:
the ionic compound comprises at least one of the one or more transition metals from the first structure; and
said first structure includes the at least one of the one or more transition metals in the form of one or more of a metal silicide, a metal carbide, a metal nitride and a metal boride.

33. The integrated assembly of claim 1 wherein the gap region is only located in a source/drain region of the second structure.

34. The integrated assembly of claim 1 wherein the gap region exposes the one or more transition metals of the first structure.

35. The integrated assembly of claim 22 wherein the gap region is only located in a source/drain region of the second structure.

36. The integrated assembly of claim 28 wherein the gap region is only located in a source/drain region of the second structure.

37. An integrated assembly, comprising:
a first structure which includes one or more transition metals;
a second structure over and directly against the first structure establishing an interface between the first and second structures; the second structure comprising semiconductor material which includes at least one element selected from Group 13 of the periodic table in combination with at least one element selected from Groups 15 and 16 of the periodic table;
a gap region undercutting a portion of the second structure at the interface;
an ionic compound within the gap region; and
wherein the gap region exposes the one or more transition metals of the first structure.

38. The integrated assembly of claim 37 wherein the ionic compound couples the one or more transition metals of the first structure to the second structure.

* * * * *